US008718111B1

(12) United States Patent
Zhu et al.

(10) Patent No.: US 8,718,111 B1
(45) Date of Patent: May 6, 2014

(54) DIODE LASER

(75) Inventors: Lin Zhu, Central, SC (US); Yunsong Zhao, Clemson, SC (US)

(73) Assignee: Clemson University, Clemson, SC (US)

( * ) Notice: Subject to any disclaimer, the term of this patent is extended or adjusted under 35 U.S.C. 154(b) by 85 days.

(21) Appl. No.: 13/478,392

(22) Filed: May 23, 2012

Related U.S. Application Data

(60) Provisional application No. 61/490,688, filed on May 27, 2011.

(51) Int. Cl.
| | |
|---|---|
| *H01S 5/00* | (2006.01) |
| *H01S 5/026* | (2006.01) |
| *H01S 5/028* | (2006.01) |
| *H01S 5/12* | (2006.01) |
| *H01S 5/183* | (2006.01) |

(52) U.S. Cl.
CPC . *H01S 5/026* (2013.01); *H01S 5/00* (2013.01); *H01S 5/0287* (2013.01); *H01S 5/1209* (2013.01); *H01S 5/1228* (2013.01); *H01S 5/1237* (2013.01); *H01S 5/18341* (2013.01)
USPC .................. 372/50.11; 372/43.01; 372/44.01; 372/50.1

(58) Field of Classification Search
CPC ......... H01S 5/00; H01S 5/026; H01S 5/0287; H01S 5/1209; H01S 5/1228; H01S 5/1237; H01S 5/18341
USPC .................................. 371/43.01, 44.01, 50.11
See application file for complete search history.

(56) References Cited

U.S. PATENT DOCUMENTS

| | | | | |
|---|---|---|---|---|
| 4,975,923 | A * | 12/1990 | Buus et al. | ................. 372/50.11 |
| 5,337,328 | A | 8/1994 | Lang et al. | |
| 6,122,299 | A | 9/2000 | DeMars et al. | |
| 7,609,919 | B2 * | 10/2009 | Tolstikhin et al. | ............. 385/37 |
| 2012/0257490 | A1 * | 10/2012 | Zhou | ............................ 369/121 |

* cited by examiner

*Primary Examiner* — Dung Nguyen

(74) *Attorney, Agent, or Firm* — Dority & Manning, PA

(57) ABSTRACT

A diode laser includes a p-contact layer, a n-contact layer, and a wafer body disposed between the p-contact layer and the n-contact layer, the wafer body having a front end and a back end. The diode laser further includes a first grating comprising a plurality of grooves defined in the wafer body and extending between the front end and the back end at a first tilt angle, and a second grating comprising a plurality of grooves defined in the wafer body and extending between the front end and the back end at a second tilt angle, the second tilt angle opposite to the first tilt angle. A coupling region is defined in the wafer body by interleaving portions of the first grating and the second grating. The interleaving portions provide coherent coupling of laser beams flowing through the first grating and the second grating.

8 Claims, 7 Drawing Sheets

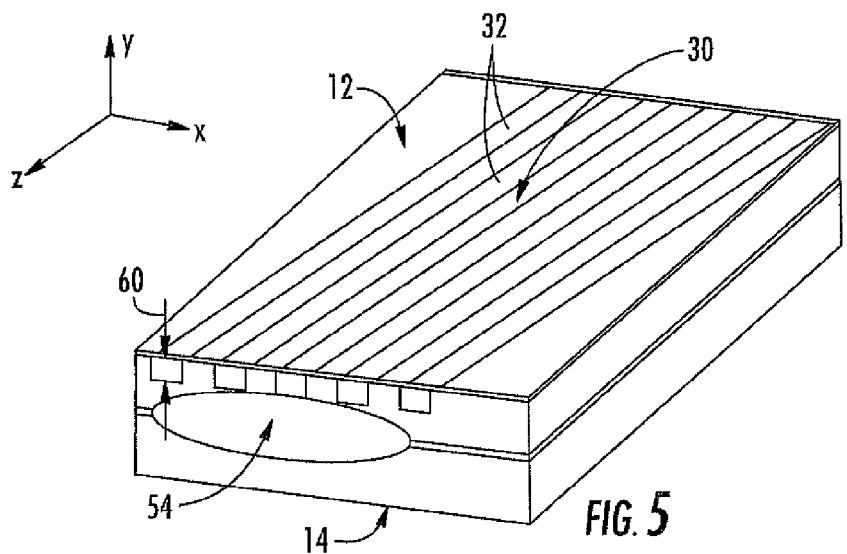
*FIG. 5*
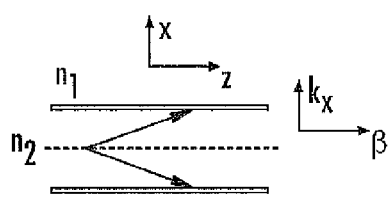
*FIG. 6*
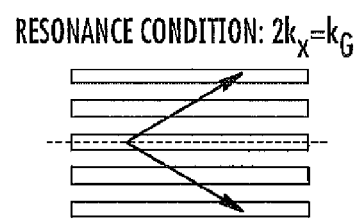
RESONANCE CONDITION: $2k_x = k_G$
*FIG. 7*
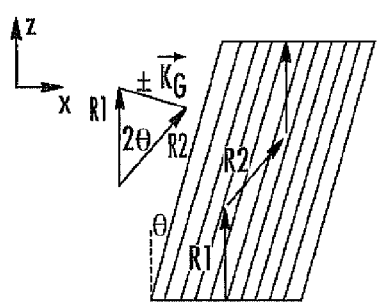
*FIG. 9*
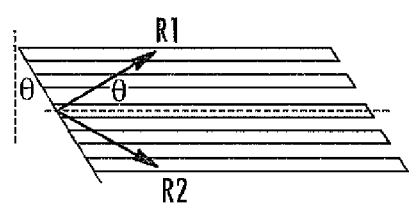
*FIG. 8*
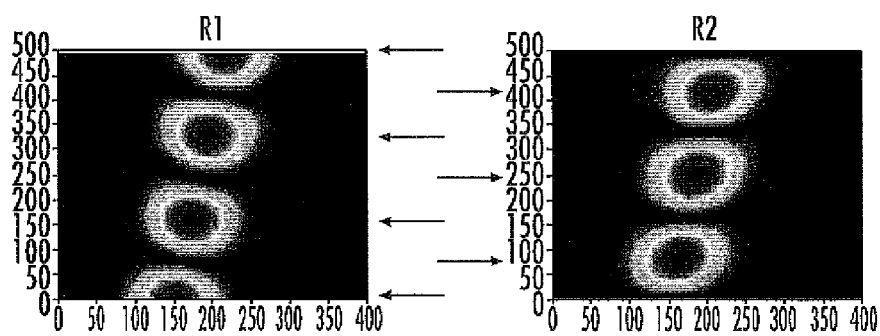
*FIG. 10*     *FIG. 11*

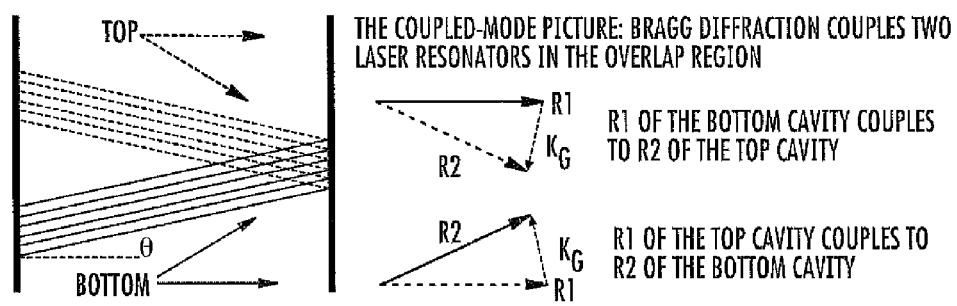
FIG. 12
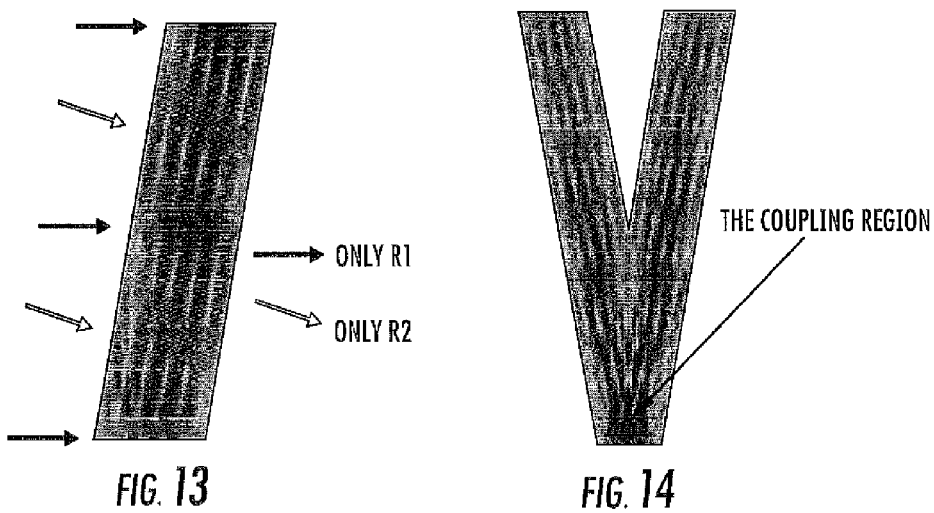
FIG. 13
FIG. 14

} COUPLED EMITTER

SINGLE EMITTER

DIODE LASER

CROSS REFERENCE TO RELATED APPLICATION

The present application claims filing benefit of U.S. Provisional Patent Application Ser. No. 61/490,688, filed on May 27, 2011, which is incorporated by reference herein in its entirety.

FEDERALLY SPONSORED RESEARCH AND DEVELOPMENT

This invention was made with government support under contract number W911NF-10-1-0323 awarded by the U.S. Department of Defense (Defense Advanced Research Projects Agency). The government has certain rights in the invention.

BACKGROUND

High power, high brightness diode lasers have been sought since the invention of the semiconductor laser. In recent years, this demand has been strongly driven by an increasing number of emerging applications, such as free space optical communication and sensing, laser material processing, medicine, display, fundamental science, and laser weapons. High power can be obtained by increasing the physical size of a diode laser, e.g., using a wider emitting aperture and longer cavity. High spatial brightness requires the single transverse mode operation to generate diffraction-limited, single-lobe far fields. Each of these approaches has limits and disadvantages.

Semiconductor diode lasers provide many unique advantages over other laser systems, such as a wide range of operation wavelengths, high electrical to optical conversion efficiency, high compactness, and low cost. Two examples of diode lasers are contained in, for example, U.S. Pat. No. 5,337,328 to Lang et al. and U.S. Pat. No. 6,122,299 to DeMars et al., both of which are incorporated by reference herein in their entirety. On the negative side, high power, high brightness (diffraction-limited beam quality) operation is difficult to obtain due to highly nonlinear materials and strong coupling between gain and index. Today, broad area diode lasers are usually used for high power applications, such as material processing and pumping sources for solid-state and fiber lasers. A few watts output power can be obtained by use of a single emitter and a few hundred watts output power can be obtained by use of a laser bar that consists an array of broad area lasers. Due to lack of transverse mode control and strong nonlinear effects, broad area lasers exhibit poor beam quality and cannot provide high brightness. Broad area laser arrays have even worse beam quality. The most common method to control the transverse mode of a diode laser is to use a step-index waveguide structure. However, for a conventional index-guided edge emitting laser, e.g., a ridge waveguide or buried waveguide laser, the laser width has to be less than a few microns in order to obtain the single transverse mode operation to maintain good beam quality. This limits the laser output power less than a few hundred miliwatts. Increasing the laser emitting width while maintaining a single transverse mode not only scales up the output power but reduces the far field beam divergence, which is highly desired for high power, high brightness applications.

There are a variety of techniques available to obtain a large aperture single transverse mode diode laser. Depending on if external optical components are needed, these techniques can be divided into two categories. The first category can be monolithically implemented, including: 1) evanescently coupled laser arrays, where multiple narrow single transverse mode lasers are coupled together to form a super transverse mode; 2) chirped and Y-coupled laser arrays; 3) leaky wave coupled (anti-guided) laser arrays; 4) unstable resonators, e.g., curved mirror or tapered lasers. These unstable resonators can be designed as either independent lasers or amplifiers in master oscillator power amplifier (MOPA) configuration; 5) grating confined broad area lasers ($\alpha$-DFB), where angled gratings are used to select a single transverse mode and provide strong modal discrimination. The second category typically requires external optical components and includes externally injection locked laser arrays, external cavity laser arrays through diffractive coupling, and/or discrete MOPA lasers. By use of these mode control techniques, few watts diffraction-limited output power can be obtained. Further increasing of the optical power in a single emitter is limited by Catastrophic Optical Damage (COD) and stability/thermal problems.

Higher optical power and brightness can be obtained through laser beam combining. There are two main beam combining techniques: coherent beam combining (CBC) and spectral beam combining (SBC). SBC systems rely on an external grating to spatially overlap beams from different lasers which operate at different wavelengths. SBC is an incoherent combining technique and results in very broad spectrum width. In CBC systems, all the lasers operate at the same wavelength and are phase-locked. Previously discussed laser arrays actually can be considered as early CBC systems. CBC not only scales up the total optical power but also increases the coherent emitting aperture. Therefore, the beam divergence in CBC systems is further reduced. Currently, most CBC systems are based on the MOPA configuration with active feedback. A single frequency laser output is split and amplified, e.g., by high power fiber amplifiers. The phase of each individual amplified beam is controlled by a discrete optical phase modulator. The phase difference among the array elements is detected and then feedback to control the phase modulator in order to phase lock all the beams. Although current SBC and CBC systems can provide high diffraction-limited power, they cannot be monolithically implemented and are inefficient, complex, bulky, and expensive. Furthermore, it is very difficult to apply these techniques for diode laser arrays.

As such, an improved diode laser is desired in the art. In particular, a diode laser that provides relatively high power and high brightness would be advantageous. Further, a diode laser that does not require external optical components would be desired.

SUMMARY

In one embodiment, the present disclosure is directed to a diode laser. The diode laser includes a p-contact layer, a n-contact layer, and a wafer body disposed between the p-contact layer and the n-contact layer, the wafer body having a front end and a back end. The diode laser further includes a first grating comprising a plurality of grooves defined in the wafer body and extending between the front end and the back end at a first tilt angle, and a second grating comprising a plurality of grooves defined in the wafer body and extending between the front end and the back end at a second tilt angle, the second tilt angle opposite to the first tilt angle. A coupling region is defined in the wafer body by interleaving portions of the first grating and the second grating. The interleaving portions provide coherent coupling of laser beams flowing through the first grating and the second grating.

In another embodiment, the present disclosure is directed to an angled-grating broad-area diode laser. The laser includes a p-contact layer, a n-contact layer, and a wafer body disposed between the p-contact layer and the n-contact layer. The laser further includes a first grating and a second grating defined in the wafer body, the first grating and the second grating symmetrical about a central axis. The first grating and the second grating are configured to provide coherent coupling through Bragg diffraction.

BRIEF DESCRIPTION OF THE FIGURES

A full and enabling description of the presently disclosed subject matter, including the best mode thereof, to one of ordinary skill in the art, is set forth more particularly in the remainder of the specification, including reference to the accompanying figures, in which:

FIG. 5 is a perspective view of an angled-grating-confined broad area laser according to one embodiment of the present disclosure;

FIG. 6 is a schematic view of an index-guided waveguide according to one embodiment of the present disclosure;

FIG. 7 is a schematic view of a grating-guided Bragg waveguide according to one embodiment of the present disclosure;

FIG. 8 is a schematic view of an angled grating waveguide/resonator according to one embodiment of the present disclosure;

FIG. 9 is a schematic view of the coupling between two planewave-like components of an angled-grating-confined laser resonator according to one embodiment of the present disclosure;

FIG. 10 illustrates positions shown in FIG. 9 (indicated by black arrows) where R1 achieves its maximum;

FIG. 11 illustrates positions shown in FIG. 9 (indicated by blue arrows) where R2 achieves its maximum;

FIG. 12 is a schematic view of the phase-locking (wave coupling) mechanism in a monolithic folded supercavity according to one embodiment of the present disclosure;

FIG. 13 shows the electrical field distribution of the cavity mode for a single grating confined resonator according to one embodiment of the present disclosure;

FIG. 14 shows the electrical field distribution of a coupled cavity, or coupling region, according to one embodiment of the present disclosure;

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made to the disclosed subject matter without departing from the scope or spirit of the disclosure. For instance, features illustrated or described as part of one embodiment, may be used with another embodiment to yield a still further embodiment.

In general, the present disclosure is directed to a diode laser. The diode laser includes a first grating and a second grating. The gratings are typically defined in a body of the diode laser, and extend between a front end and a back end of the laser. The first grating extends between the front end and the back end at a first tilt angle. The second grating extends between the front end and the back end at a second tilt angle. The second tilt angle is opposite to the first tilt angle, as discussed and shown herein. A coupling region is defined due to interleaving of the first and second grating. Interleaving advantageously provides coherent coupling of laser beams flowing through the first and second gratings. Such coherent coupling provides a high power, high brightness output.

In particular embodiments, for example, the present disclosure is directed to monolithic coherent beam combining of angled-grating board-area diode lasers. The angled-grating broad-area laser ($\alpha$-DFB laser) is used as the building element, where the grating and angled geometry provide the single waveguide mode operation and strong modal discrimination by filtering out other spatial modes. Bragg diffraction is utilized to directly couple two angled-grating broad-area lasers by overlapping their output facets. The overlapped region forms a triangular photonic crystal coupler that coherently combines the two lasers. In-phase operation is preferred since optical gain is provided at the coupling region. Diode lasers according to the present disclosure can obtain near-diffraction-limited beam quality and coherent beam combining at the same time for broad-area diode lasers.

Figure 1:
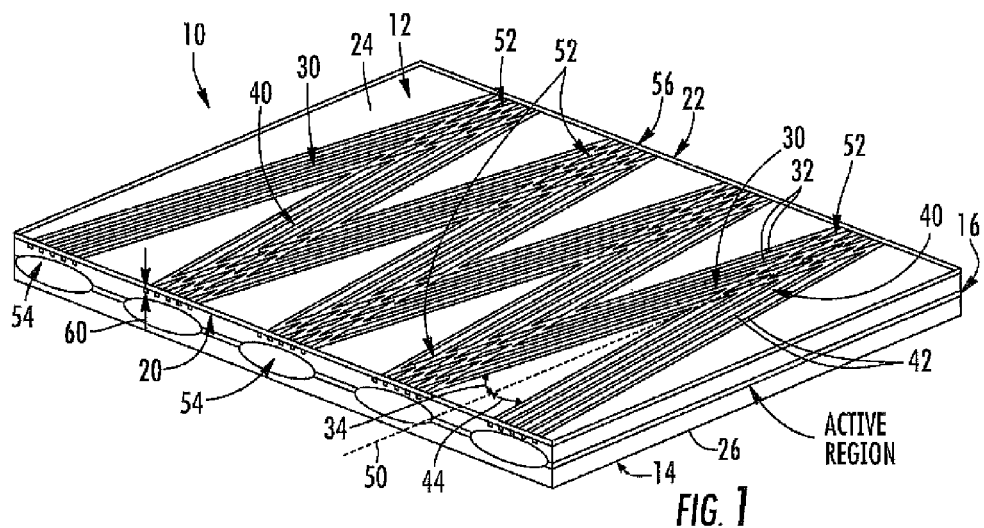
FIG. 1 is a perspective view of a diode laser according to one embodiment of the present disclosure.

FIG. 1 illustrates one embodiment of a diode laser 10 according to the present disclosure. As shown, the diode laser 10 includes a variety of layers. For example, a diode laser 10 may include a p-contact layer 12 and an n-contact layer 14. A wafer body 16 may be disposed between p-contact layer 12 and n-contact layer 14. Each of the p-contact layer 12, n-contact layer 14, and wafer body 16 may include one or more layers, as discussed below.

The laser 10, such as the wafer body 16 thereof, may have a first end 20 and a second end 22, as well as a p-contact side surface 24 and an n-contact side surface 26. One or more first gratings 30 may be defined in the wafer body 10, such as in the p-contact side surface 24 of the wafer body 10. Each grating 30 includes a plurality of grooves 32, each of the plurality of grooves 32 spaced apart from each other and extending generally parallel to one another. Each first grating 30 extends between the first end 20 and the second end 22 at a first tilt angle 34. One or more second gratings 40 may additionally be defined in the wafer body 16, such as in the p-contact side surface 24 of the wafer body 10. Each grating 40 includes a plurality of grooves 42, each of the plurality of grooves 42 spaced apart from each other and extending generally parallel to one another. Each second grating 40 extends between the first end 20 and the second end 22 at a second tilt angle 44. The second tilt angle 44 is approximately opposite the first tilt angle 34. Thus, as shown for example in FIG. 1, an associated first grating 30 and second grating 40 may be generally symmetrical about a central axis 50 extending between the first grating 30 and second grating 40.

As shown, a coupling region 52 is defined in the wafer body 10 by interleaving portions of a first grating 30 and second grating 40. Thus, a plurality of first grooves 32 and a plurality of second grooves 42 are interleaved, and have a generally symmetrical orientation. As discussed below, such interleaving provides coherent coupling of laser beams flowing through the first grating 30 and second grating 40. Further, facets of the first grating 30 and second grating 40 may overlap due to such interleaving. As shown in FIG. 1, first side facets 54 and second side facets 56 are overlapping facets of both a first grating 30 and an adjacent second grating 40. The creation of a coupling region 52 and the angling of the second tilt angle 44 to be approximately opposite to the first tilt angle 34 results in coherent coupling of resulting laser beams. Coherent coupling advantageously provides relatively high power and high brightness characteristics for the laser 10.

In some embodiments, the first tilt angle 34 may be between approximately 5 degrees and approximately 20 degrees, such as between approximately 10 degrees and approximately 15 degrees. The second tilt angle 44 in these embodiments is between approximately −5 and approximately −20 degrees, such as between approximately −10 degrees and approximately −15 degrees. Tilt angles 34 and 44 may be measured with respect to axis 50. It should be understood that the present disclosure is not limited to the above disclosed ranges, and rather that any suitable tilt angles, including other such tilt angles as disclosed herein, are within the scope and spirit of the present disclosure.

Each groove 32, 42 may further have a suitable depth 60. In exemplary embodiments, for example, the depth 60 may be less than or equal to approximately 1 µm. It should be understood that the present disclosure is not limited to the above disclosed range, and rather that any suitable depths, including other such depths as disclosed herein, are within the scope and spirit of the present disclosure.

Any suitable material composition may be utilized for diode lasers 10, and various layers thereof, such as the wafer body 16 and various layers thereof, according to the present disclosure. Typically, material compositions are combinations of III-V compound semiconductors, such as InP-based materials (InP/InGaAsP, for example) or, alternatively, GaAs-based materials (GaAs/AlGaAs, for example).

Diode lasers according to the present disclosure may advantageously provide on-chip coherent combining of a large amount of high power, high brightness broad area semi-conductor lasers with diffraction-limited beam quality without any external optical components or differential phase feedback mechanisms. The angled grating confined broad area laser can be used as the building element and take advantage of its zig-zag mode profile. By evenly interleaving two symmetric grating confined laser arrays with opposite tilt angles, direct optical coupling, induced by Bragg diffraction, can be obtained between any two adjacent elements. In exemplary embodiments, it is the direct optical coupling that coherently combines all the laser elements. The whole structure can be also considered as a folded supercavity in which all the lasers achieve mutual coherence. In this sense, a laser bar that usually consists of many incoherent broad area lasers with poor beam quality can be turned into a coherent super-cavity laser with diffraction-limited beam quality. The electrical to optical conversion efficiency may also be enhanced due to the zig-zag mode profile and the single transverse mode operation.

The angled grating confined broad area laser was chosen as the building block of the proposed monolithic coherent beam combining system since it provides superior performance and unique modal properties. First, each individual laser (also referred to as an individual grating) can provide the stable single transverse mode operation with a very wide (>100 µm) aperture. Several watts diffraction-limited continuous wave (CW) output power has been obtained by use of this design. Second, the 2D version of the design, i.e., photonic crystal distributed feedback (PCDFB) laser, can provide the single frequency, high power operation to achieve both high spatial and spectral brightness. In addition, two orders of magnitude improvement of the wavelength tuning sensitivity has been demonstrated by the PI for PCDFB lasers, which enables the precise wavelength control in the optical domain. Most importantly, due to its unique angle geometry and grating waveguiding mechanism, the transverse symmetry is broken and the cavity mode propagates in a zig-zag snake pattern. The zig-zag mode profile allows us to directly couple two lasers with opposite tilt angles through Bragg diffraction, which is the key to obtain the phase locking of all the lasers on a bar (also referred to as a diode laser).

Figure 2:
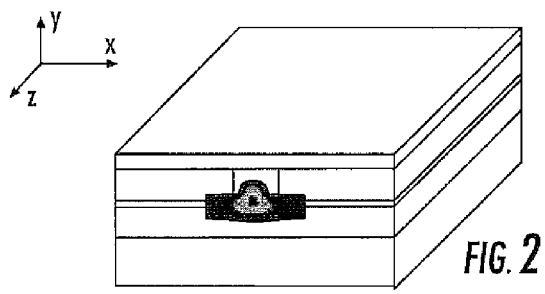
FIG. 2 is a perspective schematic view of a Fabry-Perot edge emitting semiconductor diode laser according to one embodiment of the present disclosure.

Waveguiding mechanism based on total internal reflection (TIR) is the most commonly used method for the modal control of semiconductor lasers. For example, in a typical Fabry-Perot (FP) cavity laser, the lasing modes are guided by the epitaxially grown separate confinement heterostructure (SCH) in the vertical direction and the buried waveguide structure in the transverse direction. As shown in FIG. 2, for edge emitting lasers, we define the wafer growth direction as the vertical direction, the light emitting direction as the longitudinal direction, and the last direction as the transverse direction.

In order to obtain high power, high brightness diode lasers, we need to increase the laser width and maintain the single transverse mode operation. However, this goal cannot be achieved by use of a simple index-guided laser structure.

First, the refractive index difference between the core and the cladding needs to be very small to keep the single transverse mode operation if the laser width is large. But the current injection will change the refractive index profile due to the carrier distribution. In this way, the single transverse mode operation will not hold any more. Second, strong nonlinear effects, such as filamentation, thermal lensing, and self-focusing, will change the refractive index distribution and result in many undesired transverse modes.

Figure 3:
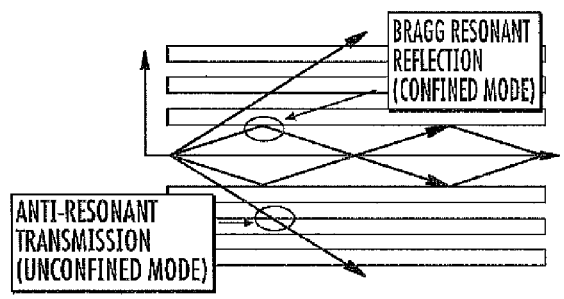
FIG. 3 is a schematic view of a grating-confined broad area laser structure according to one embodiment of the present disclosure.

Grating-confined diode laser ($\alpha$-DFB) is a type of edge emitting semiconductor laser which consists of a periodic Bragg grating in the transverse direction, as shown in FIG. 3. These lasers use the Bragg reflection from the grating rather than total internal reflection to confine and guide light in the transverse direction. In the wafer plane (x-z), a mode that satisfies the transverse Bragg resonance (TBR) condition will be confined due to the distributed Bragg reflection. Light that does not satisfy this condition will be lost. In the same way that the grating in conventional DFB structures fixes the longitudinal wavevector, the transverse grating selects a single wavevector in the transverse direction. The TBR waveguide allows the single transverse mode operation with a very large laser width (>100 μm) and it is very important for designing single-mode, broad area semiconductor lasers for high power, high brightness applications.

Figure 4:
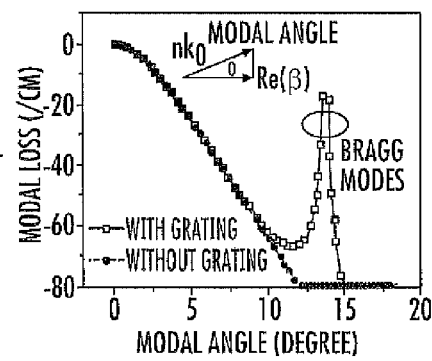
FIG. 4 is a graph illustrating different waveguide modes inside the structure shown in FIG. 3, with an inset illustrating the definition of characteristic modal angle $\theta = \cos^{-1}(\text{Re}(\beta)/(2\pi n_{avg}/A))$.

It is clear that only waveguide modes confined by the grating (Bragg modes, grouped by a circle in FIG. 4) can provide strong intermodal discrimination to support the single transverse mode operation. Other modes are closely spaced and thus have very small modal discrimination. In order to select the Bragg modes as the lasing modes, we need to reduce the modal loss of the Bragg modes and suppress other low loss modes. We can use stronger gratings, i.e., gratings with larger index contrasts, to reduce the propagation loss of the Bragg modes. However, even if the Bragg modes have very low losses, we still need to suppress other low loss modes so that the Bragg modes would be the only modes that can lase. In FIG. 4, there are a lot of low loss modes with small modal angles (<2°). These modes with small modal angles are usually referred as FP-like modes and need to be suppressed. Furthermore, the nonlinear effects, such as filamentation, self-focusing, and thermal lensing, also result in some unwanted low loss waveguide modes. Fortunately, these unwanted waveguide modes also have small characteristic angles (<2°). We can use an angled geometry to suppress these modes by preventing them from obtaining the feedback from the facets. This mechanism is also applied in many optical experiments where angled facets are used to suppress FP modes. FIG. 5 shows the schematic of an angled grating confined laser. In this design, optical gain is only provided for the grating region so that the Bragg guided mode becomes the preferred lasing mode and the competing modes with small modal angles will be suppressed. In the embodiment shown in FIG. 5, the grating is etched on the wafer surface to avoid the regrowth. Polyimide is used to planarize the surface.

As discussed above, the present disclosure provides monolithic coherent combining of multiple angled grating broad area lasers, such as by use of the structure as shown in FIG. 1. The key here is to introduce two symmetric angled grating laser arrays with opposite tilt angles and evenly interleave them. Preferably, the grating parameters, such as period, duty cycle, and index contrast, are the same for all the individual lasers (gratings). The overlap region, or coupling region, may include two dimension periodic structures (photonic crystals) so that Bragg diffraction can couple the cavity modes of individual lasers. Strong optical coupling of the cavity modes in the overlap region between two adjacent lasers leads to mutual coherence. Preferably, for each individual laser, the phase accumulated in a round-trip has to be integer multiples of $2\pi$. Therefore, all the emitting apertures along one side of the bar are in phase. Since every laser can have a large width and provide diffraction-limited beam quality, the coherently combined output beam from a single laser bar produce much higher power and brightness.

In order to understand the mode profile and phase-locking mechanism of the folded supercavity laser, we need to start from an individual angled grating laser resonator. In FIGS. 6 through 8, we show different waveguide modes. FIG. 6 shows a conventional index-guided waveguide. $k_x$ is the transverse wavevector and $\beta$ is the longitudinal wavevector. The electrical field in the core region can be written as $E=Ae^{-j(k_x x+\beta z)}+Be^{-j(-k_x x+\beta z)}$, which means that the mode in the core region consist of two intersecting planewaves by use of a ray optics picture. By using the coupled-mode theory, the grating-guided Bragg mode in FIG. 7 can be written as $E=A(x)e^{-j(k_x x+\beta z)}+B(x)e^{-j(-k_x x+\beta z)}$, where the transverse wavevector satisfies the resonance condition $2k_x=k_G$. Thus the Bragg guided mode consists of two quasi-planewave components. Their envelop are $A(x)$ and $B(x)$, respectively. The distribution of $A(x)$ and $B(x)$ should be identical due to the symmetry. FIG. 8 shows an angled grating waveguide/resonator. There are also two quasi-planewave components R1 and R2. Both of them satisfy the Bragg resonance condition. This waveguide/resonator is not uniform along the z direction, so the electrical field is written as $E=A(x, z)e^{-j(k_x x+\beta z)}+B(x, z)e^{-j(-k_x x+\beta z)}$, where the first term corresponds to R1 and the second term corresponds to R2.

As shown in FIGS. 9 through 11, the angled grating breaks the symmetry in the transverse direction and results in a zig-zag cavity mode. The grating tilt angle is usually same as the modal characteristic angle, so that the propagation direction of R1 is perpendicular to the facet and that of R2 is not. When R1 is reflected by the facet, it will be feedback to the cavity; but for R2, it will be lost. Therefore, once used as the laser cavity, the angled grating resonator will self-adaptively select the cavity mode with the maximum R1 and the minimum R2 component at the facets (R1=1, R2=0). R1 and R2 of such mode profile are shown in FIGS. 6 (b) and (c), respectively. Along the propagation direction, these two components exchange electromagnetic energy to each other. From the bottom facet of the cavity, R1 first couples to R2 and then R2 couples back to R1. In FIGS. 10 and 11, black arrows indicate the positions where R1 achieves its maximum and blue arrows indicate the positions where R2 achieves its maximum. It is clear that when R1 achieves its maximum, R2 is zero, and vice versa. In order to obtain the lowest threshold, the cavity length should be equal to the even multiple of the coupling length between R1 and R2, which is defined as the length it takes to entirely couples R1 into R2. When this condition is not satisfied, it will result in extra reflection losses due to the nonzero R2 components around the facet and thus higher thresholds.

The phase-locking between two adjacent lasers is obtained by the wave coupling through Bragg diffraction. As shown in FIG. 12, the basic unit of a folded supercavity consists of two symmetric angled grating broad area lasers with opposite tilt angles. The grating tilt angle $\theta$ is identical to the characteristic angle of the grating confined mode. Consistent with FIG. 9, R1 is the component perpendicular to facet and the incidence angle of R2 is $2\theta$. The solid lines represent the wave components of the bottom laser and the dashed lines represent these of the top laser. In exemplary embodiments of the present disclosure, the overlap region consists of two dimensional periodic structures (photonic crystals). Thus, in the coupling region, different quasi planewave components from two laser cavities can be cross coupled. For example, when the forward-going R1 component, either from the bottom or top laser, enters the overlap region, it can couple into the R2 component of the other laser through the grating wavevector, as shown in the inset of FIG. 12. The same mechanism also holds for the backward-going R1 component. In addition, there is a second coupling mechanism assisted by the facet. When the forward-going R2 component of the bottom (top) laser is reflected by the facet, it entirely reflects into the backward-going R2 component of the top (bottom) laser. Thus the R2 component at the facet will not be lost anymore in this situation.

In FIGS. 13 and 14, preliminary finite difference time domain (FDTD) simulation results are shown. FIG. 13 shows the electrical field distribution of the cavity mode for a single grating confined resonator and the result matches the coupled-mode picture in FIG. 9 very well. Around the positions indicated by the black arrows, the mode propagation direction is perpendicular to the facet. This means that only R1 component exists at these locations. While at the positions indicated by the blue arrow, only R2 component exists. FIG. 14 shows the electrical field distribution of the coupled cavity. In the coupling region, the cavity modes of two individual lasers constructively interfere, which means that they are efficiently coupled.

Figure 15:
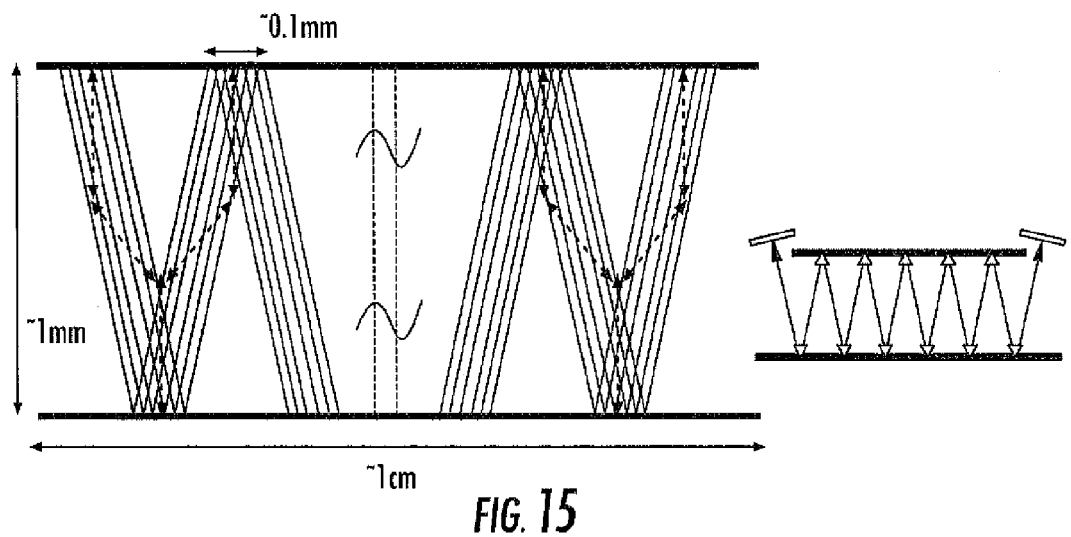
FIG. 15 is a schematic view of coherent combining of angled grating confined broad area lasers on a standard laser bar according to one embodiment of the present disclosure, wherein the dashed arrows show the wave coupling picture and the inset shows a conventional discrete folded laser cavity.

As shown in FIG. 15, the above-disclosed design can be implemented on a standard 1cm laser bar (or diode laser). The whole structure resembles a discrete folded laser as shown in the inset. In our approach, light emits form the side. The present disclosure is particularly advantageous over other coherent beam combining schemes because it does not require any external optical components or differential phase feedback mechanisms. Furthermore, the overall electrical to optical power efficiency will be increased since no optical pumping is needed. The typical width and length of an individual broad area laser is 100 μm and 1000 μm, respectively. The tilt angle is usually about 10 degrees. Thus on a standard 1 cm laser bar, more than 50 lasers can be combined together. They can provide more than 100 W diffraction-limited (high brightness) coherent power, assuming that each laser can produce 2 W output power.

Figure 16:
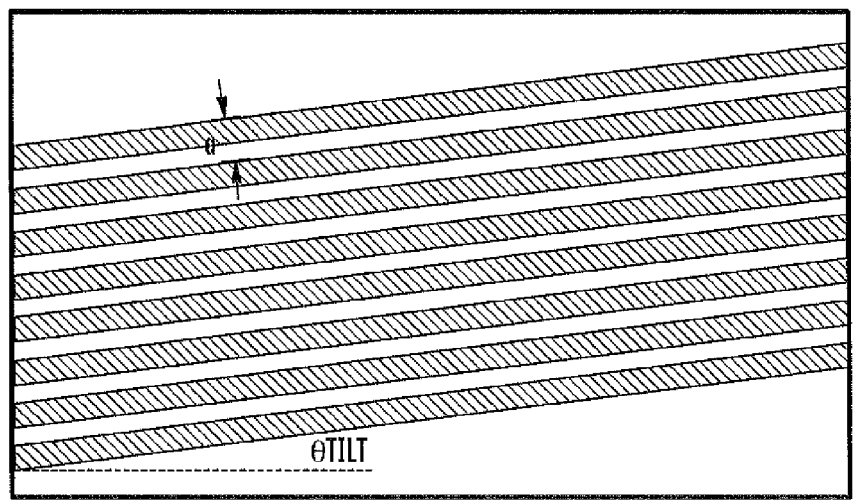
FIG. 16 is a schematic view of an angled Bragg grating in the wafer plane according to one embodiment of the present disclosure, wherein a is the grating period and $\theta_{tilt}$ is the grating tilt angle.

FIG. 16 shows a schematic of the unit grating structure in a supercavity laser. The length and width of the grating are 1 mm and 0.1 mm respectively. a is the transverse grating period and $\theta_{tilt}$ is the grating tilt angle. In the wafer plane, an optical mode that satisfies the transverse Bragg resonance condition will be confined due to the distributed reflections. This Bragg condition can be expressed as $k_x = m(\pi/a)$, where $k_x$ is the transverse wavevector of the optical mode and m is the order of the grating. We use the first order Bragg reflection (m=1). The grating duty cycle is then chosen to be 50% to obtain the maximum grating strength and fabrication tolerance. The characteristic modal angle $\theta_{res}$ is given by $\theta_{res} = \sin^{-1}(k_x/n_{eff}k_0) = \sin^{-1}(\lambda/2n_{eff}a)$. The modal angle $\theta_{res}$ should be equal to the tilt angle $\theta_{tilt}$ to reduce the cavity loss. Thus it is very important to select a proper modal angle. A large modal angle means that the optical mode will zigzag more in the grating region, which results in higher modal gain. A large tilt angle is also helpful to suppress unwanted waveguide modes with small modal angles so that the single transverse mode operation will be robust. However, when the tilt angle is large, the fill factor of the laser array, which is defined as the ratio of the emitting aperture length along the facet to the total facet length, becomes small. In order to reduce the side lobes in the far field to improve the beam quality, we want the fill factor to be close to unity. Considering all these factors, we can, for example, limit the modal angle in the range of 8° to 15°. Here we choose a=1 μm so that the modal angle (tilt angle) is 13.5°.

Etch depth of the grating may next be estimated, which determines the grating coupling coefficient and the transverse field distribution. The refractive index distribution of the grating can be written as:

$$\Delta\varepsilon(x) = \sum_m \Delta\varepsilon_m \exp(iK_m \cdot \vec{r}), \quad K_m = m\frac{2\pi}{a}\vec{x}$$

$$\Delta\varepsilon_m = \frac{1}{a}\int_{-a/2}^{a/2} \Delta\varepsilon(x,z)\exp(-iK_m \cdot \vec{r})dx$$

Figure 17:
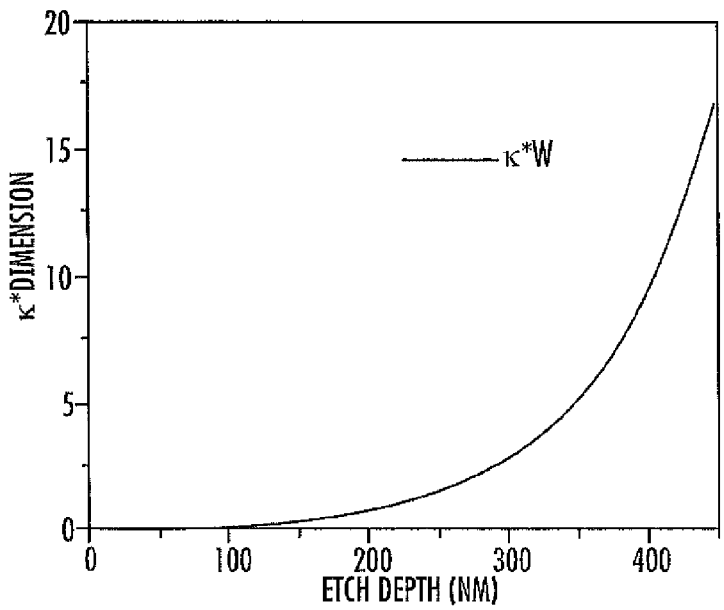
FIG. 17 is a graph illustrating KW as a function of the etch depth according to one embodiment of the present disclosure.

Assuming a rectangular grating profile with a 50% duty cycle, we can obtain the first order index perturbation and the corresponding grating coupling coefficient by use of the coupled-mode theory, shown as:

$$\Delta\varepsilon_1(y) = (n_h^2 - n_l^2)/\pi$$

$$\kappa = \frac{k_0^2}{2k_x}(n_h^2 - n_l^2)\Gamma/\pi$$

where $n_h$ and $n_l$ are the refractive indices of the high index and low index region of the grating, respectively. The product of the coupling coefficient and the grating width KW is important for the design of the grating. If it is too small, the transverse confinement is not strong enough to support the lasing action with a low threshold. If it is too large, high order spatial modes supported by the grating can lase. For practical designs, we require product of KW to be in the range of three to ten. FIG. 17 shows the calculation results of the product of KW. We can find that the optimal etch depth should be around 350 nm.

The fabrication process can be roughly divided into lithography, etching, planarization, metallization, and packing. First, the grating pattern is defined by the electron beam lithography. We use electron beam lithography for the initial device demonstration because it is flexible for different designs and provides high resolution features in comparison to the conventional UV photolithography. In the next step, the grating is transferred to a dielectric hard mask and then to the semiconductor surface. The etched trenches in the semiconductor are then planarized with polymer in order to prevent the metal contact from falling into etched holes. After this, we thermally evaporate metal contacts on the top and bottom sides of the device. Finally, a single device is cleaved and packaged on a mounting substrate, e.g., a microchannel liquid cooler or a CT mount.

Surface planarization is a key step in fabricating lasers with surface gratings. This process prevents subsequently deposited metals from falling into etched trenches. The PI has demonstrated the polyimide based planarization process for both 1D and 2D surface gratings in III-V materials. After the surface grating etch is finished, the devices are coated with a thick polyimide planarization layer. The polyimide is then etched back to the remaining dielectric mask layer. Then we strip off the remaining dielectric layer in buffered hydrofluoric (HF) acid solution. In comparison with conventional planarization methods, we can obtain a clean semiconductor surface without any polymer residue due to the dielectric isolation layer between the semiconductor and the polymer.

Diode laser formed according to the present disclosure provide increased power and brightness, without requiring external optical components. Such diode lasers additionally provide many other advantages. For example, compared to conventional coherent laser arrays, the width of each individual emitter in many embodiments according to the present disclosure can be almost two orders of magnitude larger. In addition, the Bragg diffraction based combining mechanism is much more robust against nonlinear and thermal effects. The whole structure can be also considered as a folded zigzag cavity in which all the emitters on the bar are part of a super-laser and achieve mutual coherence. It should be pointed out that light of one emitter can be directly injected not only into the adjacent emitters through the coupling regions, but also into other emitters in the array. Thus, a large number of emitters can be coherently combined, which leads to a bar-scale single mode diode laser with diffraction-limited output.

Reference now will be made to various embodiments, one or more examples of which are set forth below.

EXAMPLE 1

The laser 10 is a coherently combined angled-grating laser. The laser device is fabricated in an InP-based multiple quantum well (MQW) epitaxy wafer. In some embodiments, the wafer may be designed to emit light in the range between approximately 1000 nm and approximately 2000 nm, such as between approximately 1500 nm and approximately 1600 nm, such as approximately 1552 nm. The epitaxial structure of the wafer is shown in Table 1:

TABLE 1

Specifications of InP-Based Epitaxy Wafer

| Description | Layer | Thickness (nm) | Doping |
|---|---|---|---|
| Substrate | InP | | n |
| Buffer | InP | 1000 | n > 1018 |
| Waveguide | In0.86Ga0.14As0.32P0.68 | 70 | n = 1017 |
| Waveguide | In0.86Ga0.14As0.32P0.68 | 40 | undoped |
| Waveguide | In0.75Ga0.25As0.54P0.46 | 50 | undoped |
| 4 × Quantum Wells | In0.56Ga0.44As0.94P0.06 | 8.5 | undoped |
| 3 × Barriers | In0.75Ga0.25As0.54P0.46 | 10 | undoped |
| Waveguide | In0.75Ga0.25As0.54P0.46 | 50 | undoped |
| Waveguide | In0.79Ga0.21As0.47P0.53 | 40 | undoped |
| Waveguide | In0.79Ga0.21As0.47P0.53 | 130 | p = 1017 |
| Cladding | InP | 1200 | p = 1017 − 2 × 1018 |
| Contact layer | In0.53Ga0.47As | 200 | p > 1019 |

The combined laser cavity, or coupling region 52, consists of two sets of angled-gratings 30, 40 that tilt to the opposite directions with the same angle 34, 44. The overlap area of the two gratings defines a two dimensional coupling region 52. Phase locking of two emitters is obtained by the wave coupling through Bragg diffraction in this overlap region. The resonance wavelength is chosen to be around 1550 nm. To effectively couple two emitters and reduce modal loss in gratings, the tilt angle θ is set to be 10°. Accordingly, the grating period can be calculated to be 1.368 μm. The dimensions of a single emitter are 1.3 mm×130 μm (L×W). The etch depth of 1.0 μm is chosen to obtain a grating coupling coefficient around 0.1/μm. Light is confined by the gratings transversely and by total internal reflection vertically. The fabrication process consists of a series of steps of lithography, etching, planarization and metallization. First, a SiO2 layer is deposited by PECVD as a hard mask. Then the grating structure is defined by ebeam lithography. After two steps of dry etching, the gratings are transferred to the epiwafer. Next, the structure is planarized by spinning a layer of BCB and then it is etched back until the epiwafer surface exposes. After a SiO2 insulation layer is deposited and a contact window is opened, the p-side metal contact is deposited. Then the whole chip is thinned and n-side metal contact is deposited. After the chip is cleaved to the desired length, the laser diode 10 is mounted and wired on a c-mount for measurement.

L-I curve, spectrum, near field and far field measurement results were obtained in a cryostat system with the heat sink temperature set at 230K. In all the measurements, the lasers are electrically pumped in CW operation.

Figure 18:
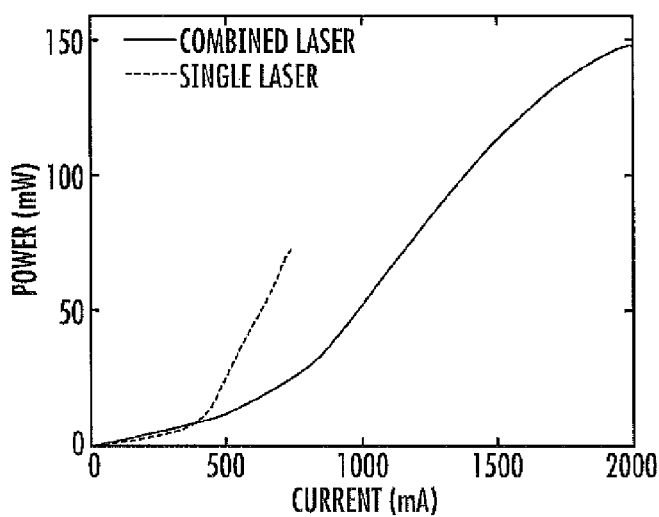
FIG. 18 is a graph illustrating measurements of the light-current curve of a combined angled-grating laser (solid line) and single emitter (dashed line) according to one embodiment of the present disclosure.
Figure 19:
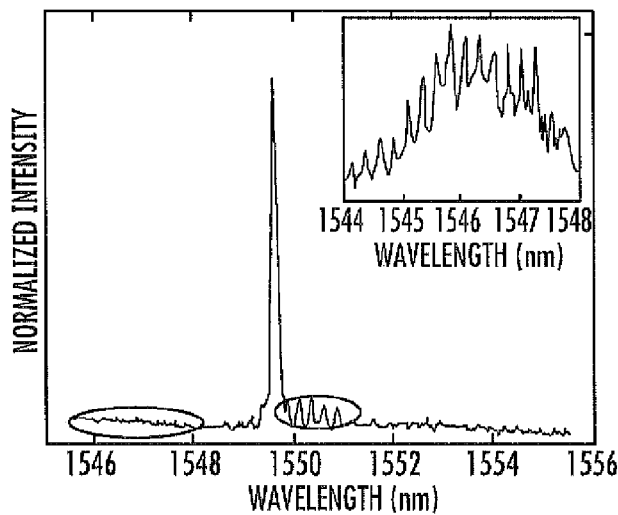
FIG. 19 is a graph illustrating measurements of the spectrum of the combined laser diode of FIG. 18 when the injection current is 1200 mA, with an inset showing a zoomed-in spectrum in the left-hand side circle.
Figure 20:
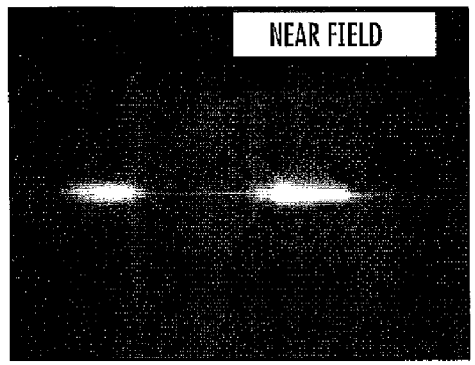
FIG. 20 is a near field image of a coupled emitter according to one embodiment of the present disclosure.
Figure 22:
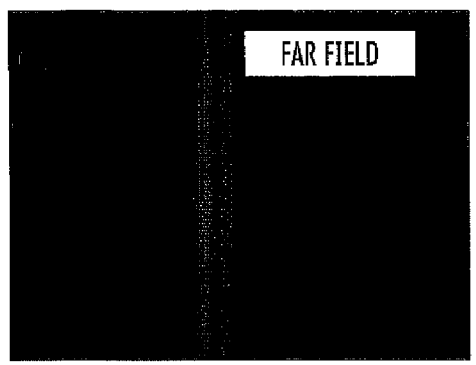
FIG. 22 is a far field image of a coupled emitter according to one embodiment of the present disclosure.
Figure 24:
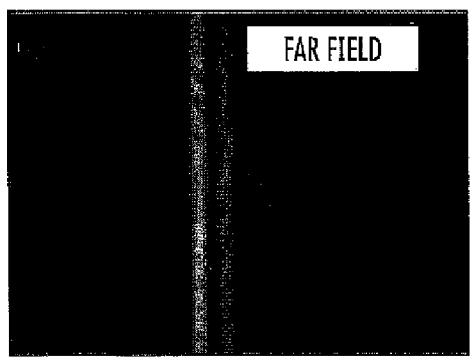
FIG. 24 is a far field image of a single emitter according to one embodiment of the present disclosure.
Figure 21:
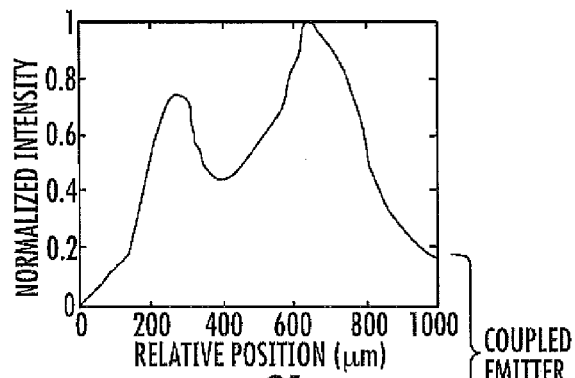
FIG. 21 is a graph illustrating a profile of the image as shown in FIG. 20.
Figure 23:
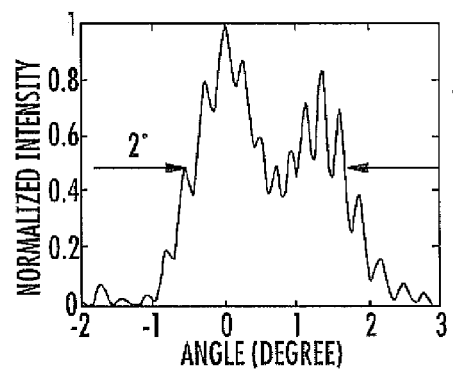
FIG. 23 is a graph illustrating a profile of the image as shown in FIG. 22.
Figure 25:
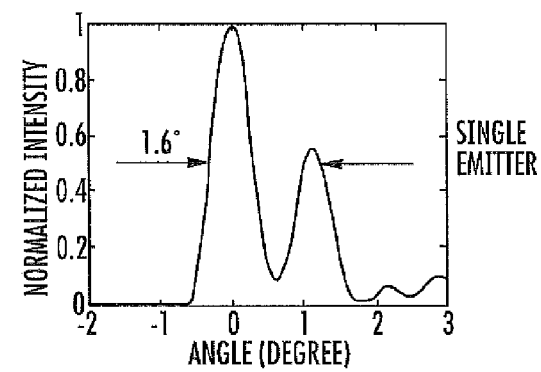
FIG. 25 is a graph illustrating a profile of the image as shown in FIG. 24.

FIG. 18 shows the light-current curve of the combined angled-grating laser. The threshold current is around 700 mA and the slope efficiency is about 0.12 W/A. The relatively low slope efficiency indicates high optical loss in the cavity which is mainly caused by the roughness of the gratings induced during the dry etching process. As for the power combining efficiency, ideally, the output power of a coupled emitter should be twice output power of a single emitter when the injected current is doubled. However, thermal effects are more serious in the combined laser due to nearly doubled heat load. When the thermal effect is not obvious, for example at 1.2 A, the output power of the coupled emitter is 78.57 mW. The output power of the single emitter is 44.74 mW at 0.6 A. Thus the corresponding power combining efficiency is about 0.9. FIG. 19 shows the optical spectrum of the same laser diode. The pump current is 1200 mA which is about 1.76. The peak wavelength is 1549.62 nm close to the designed grating resonance wavelength. The inset shows a zoomed-in spectrum from 1544 nm to 1548 nm indicating a free spectrum range (FSR) of 0.22 nm, in agreement with the cavity length of 1.3 mm. The FSR suggests that the longitudinal modes are defined by two end facets. Longitudinal mode competition is observed around the peaks in the red circle due to the small modal gain difference between the adjacent longitudinal modes FIGS. 20 and 21 show the near-field image and profile of the combined angled-grating laser. It is clear that there are two emitting regions along the facet. The difference between the intensities of the two regions comes from the nonuniformity in the wafer and induced by the fabrication processes. The distance between the two emitting regions (368 μm) and the emitting width of each region (106 μm) indicates that light indeed emits from the designed angled-grating areas. The area between two emitters is illuminated a little bit due to the current leakage. The far field of the same coupled laser is shown in FIGS. 22 and 23. We compare the far field profile of the combined laser with an uncoupled single emitter. If two coupled emitters are coherently combined and in-phase, they will constructively interfere in the far field and the overall envelop of the interfered far field remains the same as that of a single emitter. The only difference is that within the overall envelop, interference patterns present. This is exactly our measurement results, as shown in FIGS. 22 through 25. The uncoupled single emitter was fabricated on the same chip with the combined laser. The grating parameters such as the period, duty cycle, and total width are also the same. It is clear that the overall envelop of the combined laser's far field is very similar to that of the uncoupled single emitter. The fine interference patterns in FIGS. 22 and 23 prove that two emitters are coherently combined. The two lobes in the far field comes from the degeneracy of two band-edge modes of the grating since the grating etched depth is bigger than the designed value. Single-lobe far field can be obtained by introducing a central defect or 2D photonic crystal structure or by decreasing the coupling strength of the gratings. The FWHM divergence angles (1.6° for the single emitter and 2° for the combined laser) of these two lasers are still much smaller than a conventional broad-area laser (~10°). The difference in the divergence angles between the single emitter and coupled emitters are mainly due to different near-field distribution induced by the non-uniformity of fabrication and current injection.

Figure 26:
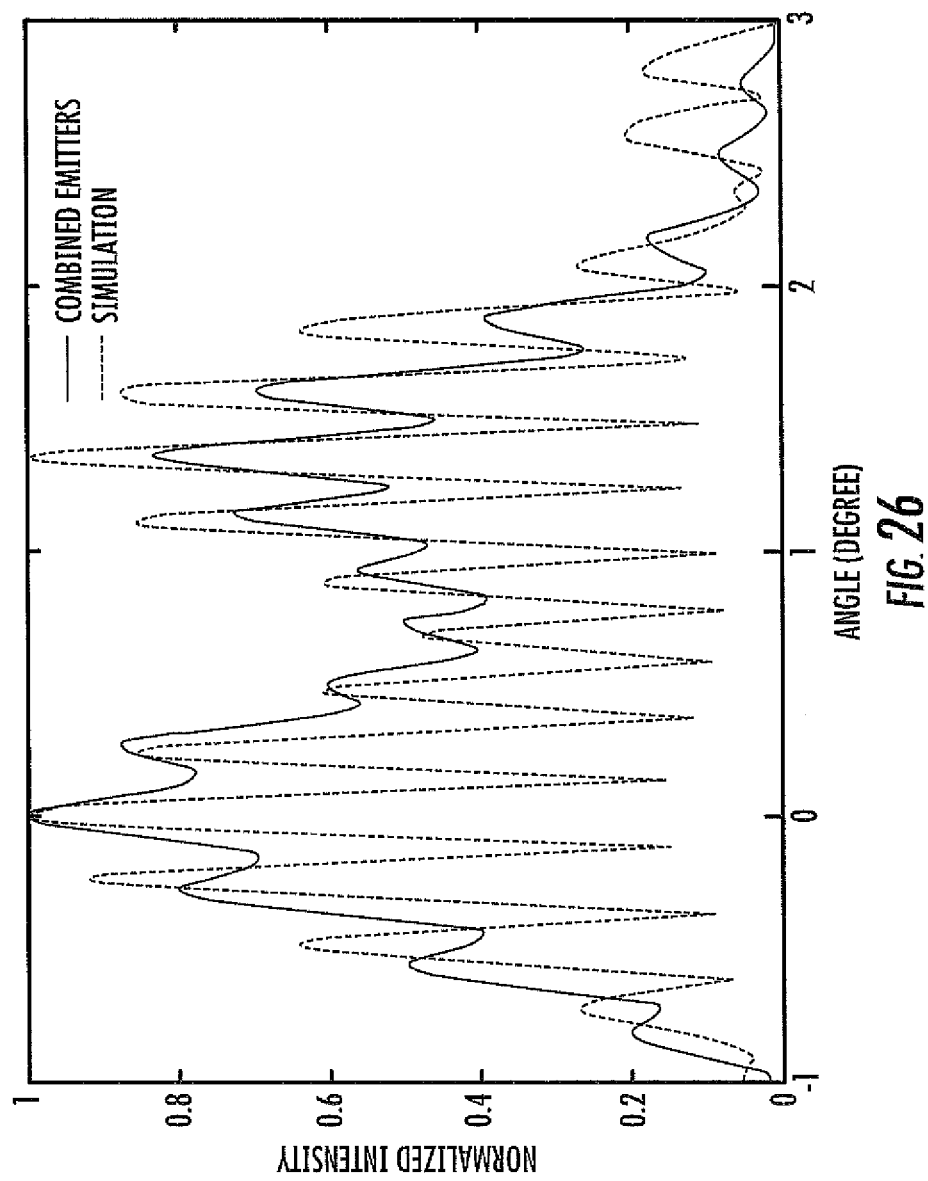
FIG. 26 is graph illustrating far-field profiles of a coherently combined laser and simulation result according to one embodiment of the present disclosure, wherein the solid line represents the measurement result of the coherently combined laser and the dashed line is the simulation result.

The distance between two emitters and the width of one emitter were extracted from the measured near-field in FIG. 20. It was assumed that the two emitters were in phase and calculated the far-field pattern by use of the standard diffraction theory. The calculation result is shown in FIG. 26 in the red dashed line and agrees well with the measured result. The angular distance between two interference stripes in the measurement result is 0.246° and it is 0.234° in the calculation. Steady interference patterns are observed when we increase the pump current up to 2 A, which proves that the combining approach is still effective under a high pump condition.

The distinction of the fringes shown in FIG. 26 is low for a few possible reasons. One is the uneven outputs from two beams as shown in FIG. 21. Multiple longitudinal modes observed in the spectrum also reduce the visibility of the fringes due to the incoherent addition of different sets of interference patterns with different spacing of fringes. Another important reason is the strong background noise in the infrared vidicon camera used.

It will be appreciated that the foregoing examples, given for purposes of illustration, are not to be construed as limiting the scope of this disclosure. Although only a few exemplary embodiments have been described in detail above, those skilled in the art will readily appreciate that many modifications are possible in the exemplary embodiments without materially departing from the novel teachings and advantages of this disclosure. Accordingly, all such modifications are intended to be included within the scope of this disclosure as defined in the following claims and all equivalents thereto. Further, it is recognized that many embodiments may be conceived that do not achieve all of the advantages of some embodiments, yet the absence of a particular advantage shall not be construed to necessarily mean that such an embodiment is outside the scope of the presently disclosed subject matter.

What is claimed is:

1. A diode laser comprising:
a p-contact layer;
a n-contact layer;
a wafer body disposed between the p-contact layer and the n-contact layer, the wafer body having a front end and a back end;
a first grating comprising a plurality of grooves defined in the wafer body and extending between the front end and the back end at a first tilt angle;
a second grating comprising a plurality of grooves defined in the wafer body and extending between the front end and the back end at a second tilt angle, the second tilt angle opposite to the first tilt angle; and
a coupling region defined in the wafer body by interleaving portions of the first grating and the second grating,
wherein the interleaving portions provide coherent coupling of laser beams flowing through the first grating and the second grating.

2. The diode laser of claim 1, further comprising a plurality of first gratings, a plurality of second gratings, and a plurality of coupling regions.

3. The diode laser of claim 1, wherein the first tilt angle is between approximately 5 degrees and approximately 20 degrees.

4. The diode laser of claim 1, wherein the first tilt angle is between approximately 10 degree and approximately 15 degrees.

5. The diode laser of claim 1, wherein a depth of each of the plurality of grooves of the first grating and the second grating is less than or equal to approximately 1 µm.

6. The diode laser of claim 1, wherein the wafer body is formed from an InP based material.

7. The diode laser of claim 1, wherein each of the plurality of grooves of the first grating is spaced apart from and extends generally parallel to others of the plurality of grooves of the first grating, and wherein each of the plurality of grooves of the second grating is spaced apart from and extends generally parallel to others of the plurality of grooves of the second grating.

8. The diode laser of claim 1, wherein the wafer body is configured to emit light in the range between approximately 1000 nm and approximately 2000 nm.

* * * * *

UNITED STATES PATENT AND TRADEMARK OFFICE
CERTIFICATE OF CORRECTION

PATENT NO.       : 8,718,111 B1
APPLICATION NO.  : 13/478392
DATED            : May 6, 2014
INVENTOR(S)      : Lin Zhu et al.

Page 1 of 1

It is certified that error appears in the above-identified patent and that said Letters Patent is hereby corrected as shown below:

In the Specification

Column 1, lines 15 - - please correct "...contract number W911NF-10-1-0323 awarded by the U.S."

to read "...contract number N6601-10-1-4038 awarded by the U.S."

Signed and Sealed this
Second Day of June, 2015

Michelle K. Lee
*Director of the United States Patent and Trademark Office*